United States Patent [19]

Yamaguchi

[11] Patent Number: 5,136,400

[45] Date of Patent: Aug. 4, 1992

[54] COLOR COPYING APPARATUS AND METHOD FOR COPYING COLOR IMAGE BASED ON SURFACE-FINISHING CONDITION OF THE COPIED MEDIUM

[75] Inventor: Toshiyuki Yamaguchi, Toyoake, Japan

[73] Assignee: Brother Kogyo Kabushiki Kaisha, Japan

[21] Appl. No.: 736,691

[22] Filed: Jul. 26, 1991

[30] Foreign Application Priority Data

Aug. 20, 1990 [JP] Japan .................................. 2-219691

[51] Int. Cl.$^5$ .......................... G03G 15/00; H04N 1/46
[52] U.S. Cl. ...................................... 358/300; 358/80; 346/157
[58] Field of Search ..................... 358/296, 300, 80, 75; 355/282, 290; 118/45, 46; 346/157

[56] References Cited

U.S. PATENT DOCUMENTS

| | | | |
|---|---|---|---|
| 4,458,265 | 7/1984 | Yoshida et al. | 358/80 |
| 4,841,360 | 6/1989 | Birgmeir | 358/80 |
| 4,929,978 | 5/1990 | Kanamori et al. | 358/80 X |
| 4,959,711 | 9/1990 | Hung et al. | 358/80 |

FOREIGN PATENT DOCUMENTS 59-199276  11/1984  Japan .................................. 355/290

*Primary Examiner*—Joan H. Pendegrass
*Attorney, Agent, or Firm*—Oliff & Berridge

[57] ABSTRACT

A color copying machine is provided with a color signal input unit for inputting red, blue and green signals representing the colors of a document, a recording unit for recording the color picture of an original color picture on the basis of printer control signals for controlling a cyan printing by using a cyan toner, a magenta printing by using a magenta toner and a yellow printing by using a yellow toner and a processing unit which changes the color signals including the red, blue and green signals into the printer control signals related to the cyan, the magenta and the yellow by using a matrix representation in conformity with a predetermined rule to produce cyan, magenta and yellow printer control signals. A surface-finishing mode selecting button allows an operator to select either a glazed finish to the recording sheet or an unglazed finish after recording the color picture thereon. The CPU determines one set of parameters to be used by the processing unit from a plurality of sets of parameters stored in the ROM according to the selected surface-finishing mode. The processing unit modifies the input color signals by using the predetermined parameters, according to the selected surface-finishing mode, and the recording unit records a color picture on a recording medium. The glazing unit glazes, or finishes, the printed recording medium according to the selected surface-finishing mode.

9 Claims, 7 Drawing Sheets

COLOR COPYING APPARATUS AND METHOD FOR COPYING COLOR IMAGE BASED ON SURFACE-FINISHING CONDITION OF THE COPIED MEDIUM

BACKGROUND OF THE INVENTION

1. Field of the Invention

The present invention relates to a color picture copying apparatus and a color copying method to be carried out by the color picture copying apparatus and, more specifically, to a color copying machine capable of finishing the surface of a color-printed recording sheet in either a glossy surface or a dull surface and of reproducing the colors of a document with excellent color reproduction, and a color copying method to be carried out by the color copying machine.

2. Discussion of the Related Art

The conventional color copying machine, such as disclosed in Japanese Patent Laid-open (Kokai) No. 57-101840, which corresponds to U.S. Pat. No. 4,458,265, or U.S. Pat No. 4,959,711, is provided with a color signal input unit for inputting color signals representing the colors of a document, such as a red signal R, a blue signal B and a green signal G which each correspond to a primary color. The color copying machine is further provided with a recording unit for recording the color picture of an original color picture on the basis of printer control signals for controlling a cyan printing by using a cyan ink C, a magenta printing by using a magenta ink M and an yellow printing by using an yellow ink Y. An arithmetic unit, which is connected to the color signal input unit and the recording unit, changes the color signals including the red signal R, the blue signal B and the green signal G into the printer control signals related to the cyan C, the magenta M and the yellow Y by using a matrix representation as represented by Expression (1) described below in conformity to a predetermined rule to produce cyan printer control signals, magenta printer control signals and yellow printer control signals.

The printer control signals define whether or not the cyan ink C, the magenta ink M and the yellow ink Y are to be applied to a recording sheet or define respective quantities of the inks to be applied to the recording sheet to record a color image on the recording sheet.

$$\begin{vmatrix} C \\ M \\ Y \end{vmatrix} = \begin{vmatrix} a11 & a21 & a31 \\ a12 & a22 & a32 \\ a13 & a23 & a33 \end{vmatrix} * \begin{vmatrix} R \\ G \\ B \end{vmatrix} \quad (1)$$

where R, G and B are input color signals representing the color picture of the original color picture, C, M and Y are printer control signals for controlling the cyan printing, the magenta printing and the yellow printing, and aij are coefficients for color modification.

When the document has a glossy surface like a photograph, it is desired that the surface of a printed recording sheet carrying the color picture copy of the original color picture be finished in a glossy surface. Therefore, a user uses a laminator to laminate a transparent lamination onto the recording sheet so that the surface of the printed recording sheet is finished in a glossy surface. On the other hand, when the document has a dull surface, it is not desired to finish the surface of the printed recording sheet with a glossy surface in most cases.

The glossy printed surface of a recording sheet has the effect of a virtual increase in photographic density and color saturation, because the glossy printed surface has a characteristic of increasing the ratio of regularly reflected light to the total light reflected in all directions. On the other hand, the dull surface has a characteristic of increasing the ratio of diffused light to the total light reflected in all directions. The effect of the dull surface is a virtual decrease in the photographic density of the color picture and color saturation.

The arithmetic unit of the conventional color copying machine has no function to modify the printer control signals according to the surface-finishing condition, that is, whether or not the recording sheet is glazed after recording the color picture thereon.

Accordingly, if the arithmetic unit is designed so as to produce printer control signals so that the colors of an original color picture are reproduced satisfactorily on a recording sheet which is not to be glazed, the photographic density and color saturation of the color picture recorded on the recording sheet will increase if the printed recording sheet is glazed which deteriorates the colors reproduced on the recording sheet.

OBJECTS AND SUMMARY OF THE INVENTION

It is an object of the present invention to overcome the above described drawbacks and disadvantages, and to provide a color copying machine and a color copying method capable of reproducing a color image of a color original on a recording sheet regardless of whether or not the recording sheet is glazed after recording the color picture thereon.

It is another object of the present invention to provide a color copying machine and a color copying method capable of satisfactorily reproducing the colors of an original color picture on either a recording sheet to be glazed after recording the color picture thereon or a recording sheet not to be glazed after recording the color picture thereon.

To attain those and other objects, the present invention provides a color copying machine comprising:

signal input means for inputting color signals representing colors of a color original, the color signals being separated on the basis of primary colors;

recording means for recording a color image on a recording medium on the basis of a plurality of control signals indicating respective quantities of respective coloring matters to be applied to the recording sheet, color of the coloring matters being different from the primary colors of the color signals input by said color signal input means;

signal changing means for changing the color signals input by said signal input means into the control signals used by said recording means on the basis of parameters so that the colors of the color original coincide with the colors of the color image on the recording medium recorded by said recording means;

glazing means for glazing the color image on the recording medium which has been recorded by said recording means;

surface-finishing mode selecting means for selecting one of a first surface-finishing mode in which the recording medium is glazed by said glazing means after recording the color image thereon and a second surface-finishing mode in which the recording medium is not glazed by said glazing means after recording the color image thereon;

parameter storage means for storing a plurality of parameters corresponding to the surface-finishing modes selected by said surface-finishing mode selecting means; and parameter determining means for determining one of the parameters stored in said parameter storage means based on the surface-finishing mode selected by said surface-finishing mode selecting means and for outputting the determined parameters to said recording means.

In the present invention, the surface-finishing mode selecting means selects one of the first surface-finishing mode and the second surface-finishing mode. The signal input means inputs signals representing the colors of the original color picture and the parameter determining means determines parameters to be used by the signal changing means among the plurality of parameters stored in the parameter storage means based on the selected surface-finishing mode. The signal changing means changes the color signals into the control signals based on the determined parameters and the recording means records the color image on the recording medium based on the color signals. The glazing means glazes the recording medium after recording the color image thereon, if the first surface-finishing mode is selected. The glazing means does not glaze the printed recording medium after recording the color image thereon, if the second surface-finishing mode is selected.

Thus, if the first surface-finishing mode is selected, the signal changing means changes the input color signals into the control signals based on the determined parameters so that the colors of the original picture are reproduced satisfactorily after the recording medium is glazed. If the second surface-finishing mode is selected, the signal changing means changes the input color signals into the control signals based on the determined parameters so that the colors of the original picture are reproduced satisfactorily after the recording medium is not glazed. Therefore, the colors of the color image copied on the recording medium having a glazed surface by the color copying machine are more satisfactory than those of the color picture copied on the same recording medium by the conventional color copying machine.

To attain the objects, the present invention provides also a color copying method comprising steps of:

inputting color signals representing the colors of an original color picture, the color signals being separated on the basis of primary colors;

selecting one of a surface-finishing mode for glazing the surface of a recording medium after recording a color image thereon and a surface-finishing mode for not glazing a surface of the recording medium after recording a color image thereon;

determining parameters among a plurality of parameters corresponding to the surface-finishing modes;

changing the input color signals into control signals on the basis of the determined parameters so that the colors of the color original coincide with the colors of the recorded color image on the recording medium, the control signals indicating respective quantities of respective coloring matters to be applied to the recording sheet, color of the coloring matters being different from the primary colors of the color signals input;

recording the color image on the recording medium on the basis of the control signals; and glazing the recording medium after recording a color image thereon when the first surface-finishing mode is selected.

BRIEF DESCRIPTION OF THE DRAWINGS

The foregoing and other objects, features and advantages of the present invention will become more apparent by reading the following detailed description of the preferred embodiments of the present invention, when considered in connection with the accompanying drawings, in which.

DETAILED DESCRIPTION OF THE PREFERRED EMBODIMENTS

A digital color copying machine 1 (hereinafter referred to simply as "color copying machine") embodying the present invention will be described hereinafter with reference to FIGS. 1 to 6.

Figure 1:
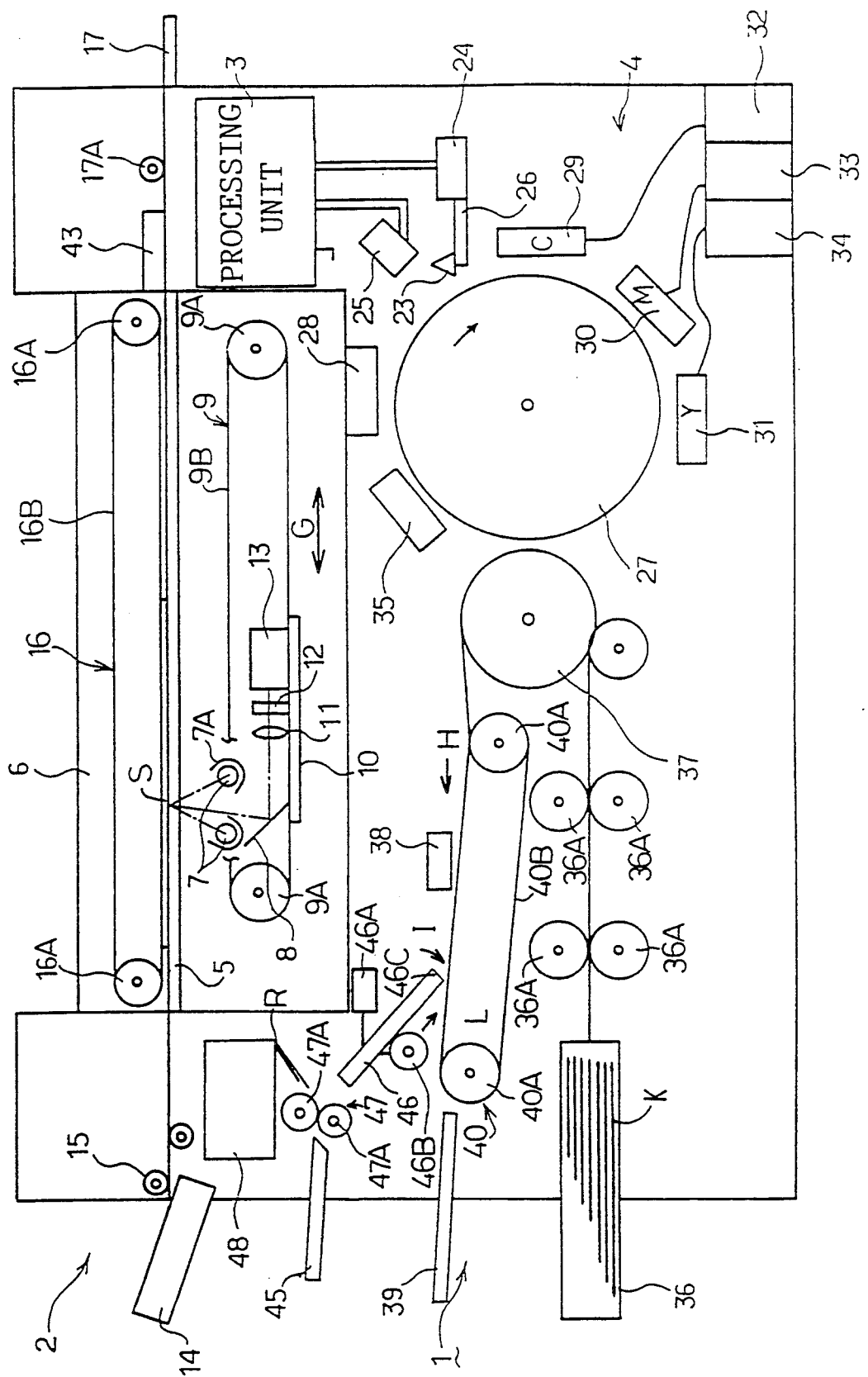
FIG. 1 is a schematic side view of a digital color copying machine in a preferred embodiment according to the present invention.

As shown in FIG. 1, the color copying machine 1 is provided with a color picture reader 2 for reading an original color picture S.

The color picture reader 2 is installed in the upper portion of the color copying machine 1. A transparent contact glass plate 5 for supporting the original color picture S is provided in the upper portion of the color copying machine 1. An original cover 6 is provided over the contact glass plate 5 so as to cover the contact glass plate 5 and to hold the original color picture S on the contact glass plate 5.

A light source carriage 10 is disposed under the contact glass plate 5. The carriage 10 moves in the directions indicated by arrow heads G (hereinafter referred to "scanning direction") in FIG. 1. Fluorescent lamps 7, serving as scanning light sources, are mounted on the carriage 10 so as to extend along a direction perpendicular to the scanning direction (hereinafter referred to as "subscanning direction"). Reflectors 7A reflect the light emitted by the fluorescent lamps 7 so as to concentrate the light on the contact glass plate 5. A reflecting mirror 8 is mounted on the light source carriage 10 so as to reflect the light emitted by the fluorescent lamps 7 and reflected by the original color picture S to the right, as viewed in FIG. 1. A lens 11 is mounted on the carriage 10 so as to condense the light reflected by the reflecting mirror 8.

A filter unit 12 is mounted on the carriage 10 to separate the light condensed by the lens 11 into a red light component, a green light component and a blue light component. A solid-state image sensor (hereinafter referred to also as "CCD") 13 is mounted on the carriage 10 so as to receive the light transmitted through the lens 11 and the filter unit 12 to convert the light components into corresponding electric signals. The filter 12 and the CCD 13 function as inputting means.

The carriage 10 is moved in the directions indicated by the arrow heads G by a light source moving device 9. The light source moving device 9 comprises a pair of pulleys 9A, a wire 9B extended between the pulleys 9A and fastened to the carriage 10, and a driving unit (not shown) for rotating one of the pulleys 9A.

An original receiving tray 14 is disposed on the left-hand side of the transparent contact glass plate 5 of the color picture reader 2. An original feed roller 15 is provided opposite to the original receiving tray 14 to feed the original picture S stored in the original receiving tray 14 toward the transparent contact glass plate 5. An original conveying device 16 for conveying the original picture S fed by the original feed roller 15 to a predetermined position on the transparent contact glass plate 5. The original conveying device 16 comprises a pair of pulleys 16A disposed with their axes extending in the subscanning direction, a belt 16B extended between the pair of pulleys 16A to move the original picture S in the direction of the arrow heads G, and a driving device (not shown) for rotating one of the pulleys 16A.

An ejecting roller 17A for ejecting the original picture S after the completion of reading operation is disposed on the right-hand side of the transparent contact glass plate 5. An original receiving tray 17 for receiving the ejected original picture S is disposed on the right-hand side of the ejecting roller 17A.

Figure 2:
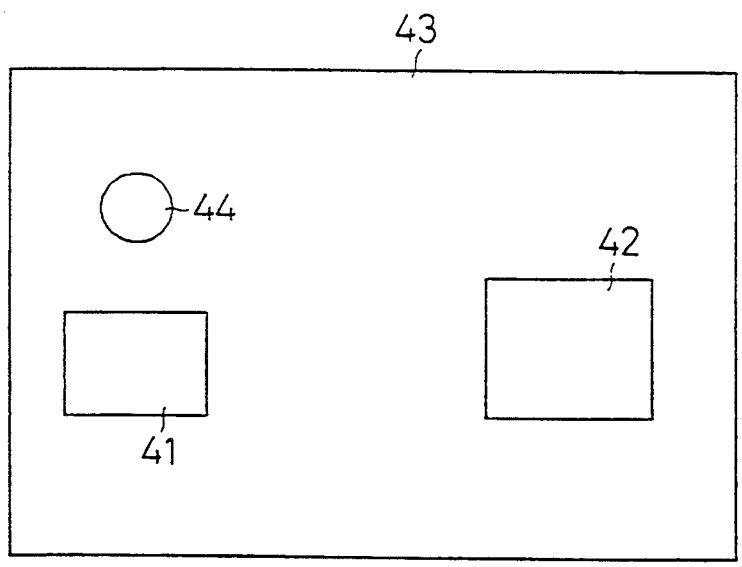
FIG. 2 is a plan view of the console panel of a color picture input unit employed in the digital color copying machine of FIG. 1.
Figure 3:
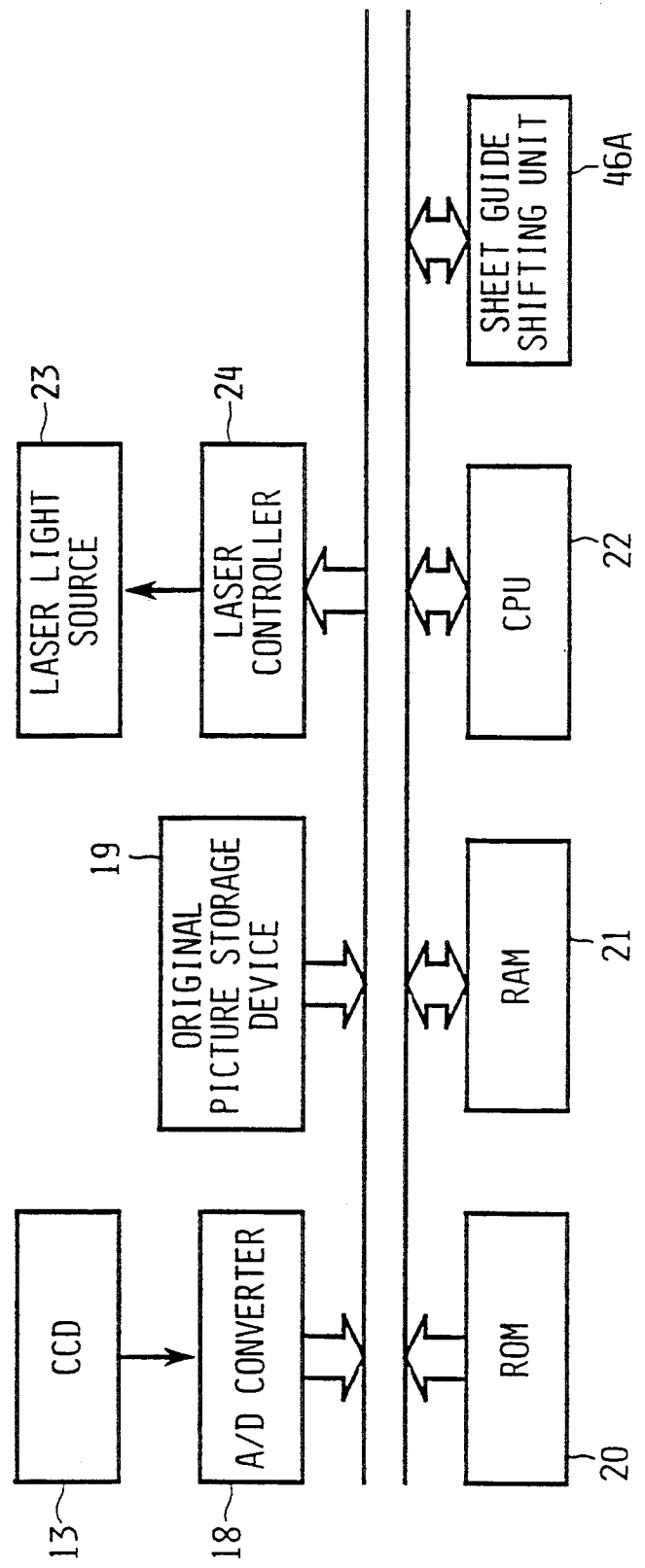
FIG. 3 is a block diagram of a color image processing unit employed in the digital color copying machine of FIG. 1.

A console panel 43 is disposed on the right-hand side of the original cover 6. As shown in FIG. 2, the console panel 43 is provided with a surface-finishing mode selector button 41 for selecting a glazing mode to glaze a recording sheet, a start button 42 and a glazing mode indicating lamp 44 which lights up when the glazing mode is selected. The surface-finishing mode selector button 41 also functions as a parameter selecting means.

The color copying machine is provided in its right-hand side with a color recording unit 4, which functions as recording means, for recording a color picture on a recording sheet as the recording medium.

The color recording unit 4 for recording a color picture on a recording sheet K is connected to a color image processing unit 3 disposed in the upper right-hand portion of the color copying machine 1. The color picture recording unit 4 is controlled by control signals provided by the color image processing unit 3. The color recording unit 4 comprises a laser light source 23 that emits a laser beam, such as employed in a known copying machine, a laser controller 24, a polygonal rotating mirror 25, and a laser modulator 26 for modulating a laser light. The laser controller 24 controls the laser modulator 26 on the basis of a laser driving signal corresponding to a control signal, and the laser light source 23 projects a laser beam onto the polygonal rotating mirror 25.

A photoconductive drum 27 is disposed near the laser light source 23 so as to be exposed to a laser beam reflected by the polygonal rotating mirror 25. A charger 28 is disposed above the photoconductive drum 27 to charge the photoconductive drum 27 uniformly so that a negative charge appears on the photoconductive drum 27. The photoconductive drum 27 thus charged by the charger 28 is exposed to the laser beam to form an electrostatic latent image thereon.

A cyan developing unit 29 for applying a cyan toner to the electrostatic latent image, a magenta developing unit 30 for applying a magenta toner thereto and an yellow developing unit 31 for applying an yellow toner thereto respectively, are arranged around the photoconductive drum 27. The cyan, magenta and yellow toners are supplied to the developing units 29, 30 and 31 from a cyan toner supply unit 32, a magenta toner supply unit 33 and an yellow toner supply unit 34, respectively, disposed in the lower portion of the color copying machine 1. A cleaning unit 35 is disposed near the photoconductive drum 27 to remove toners remaining on the photoconductive drum 27 after printing.

Recording sheets K are contained in a sheet cassette 36 provided in the left-hand side of the color copying machine 1. Rollers 36A arranged between the photoconductive drum 27 and the sheet cassette 36 transport the recording sheet K drawn out from the sheet cassette 36.

A sheet conveying unit 40 is comprised of a pair of pulleys 40A disposed with their axes extended along the subscanning direction, a belt 40B extended between the pair of pulleys 40A to convey the recording sheet K, and a driving unit (not shown) for rotating one of the pulleys 40A.

A fixing unit 38 for heat-fixing a toner image transferred onto the recording sheet K is disposed above the belt 40B. After the toner image has been fixed to the recording sheet K by the fixing unit 38, the recording sheet K is delivered to a delivery tray 39, disposed above the sheet cassette 36, when the recording sheet K need not be glazed. The sheet conveying unit 40 is disposed between the photoconductive drum 27 and the delivery tray 39. A delivery tray 45 for receiving the recording sheet K when the recording sheet K is glazed after the toner image has been fixed thereto by the fixing unit 38 is disposed above the delivery tray 39.

A sheet guide 46 is disposed above the belt 40B to guide the recording sheet K upward into the delivery tray 45.

A sheet guide shifting unit 46A, which controls the sheet guide 46, shifts the sheet guide 46 between a position where the right-hand end of the sheet guide 46 is in contact with the belt 40B and a position where the right-hand end of the sheet guide 46 is separated from the belt 40A according to a surface-finishing mode selected by operating the surface-finishing mode selector button 41 to deliver the recording sheet K after fixing to either the delivery tray 39 or the delivery tray 45.

The sheet guide shifting unit 46A moves a movable roller 46B disposed beneath the sheet guide 46 in the direction of an arrow L to turn the right-hand end 46C of the sheet guide 46 in the direction of an arrow I.

A laminator 47 is disposed between the delivery tray 45 and the sheet guide 46 to laminate a lamination material onto R and the recording sheet K. The laminator 47 has a pair of rollers 47A to compress the recording sheet K and the lamination material R superposed on the recording sheet K therebetween. The lamination material R is, for example, a lamination LPA-330 ® (Tokyo Lamix Co.). The laminate material R stored above the laminator 47 is fed to the pair of rollers 47A by a lamination feeder 48.

The color image processing unit 3 functions as color signal changing means, for changing input color signals into recording color signals by using parameters described below. The processing unit 3 is electrically connected to an analog-to-digital converter (hereinafter referred to "A/D converter") 18 for converting analog color signals provided by the solid-state image sensor 13 representing the colors of the original color picture S into corresponding digital signals.

The color image processing unit 3 has a ROM 20 for storing parameters for color signal modification determined before-hand in order that the color signals may be modified properly so that the colors of the original color picture S may satisfactorily be reproduced regardless of the selected surface-finishing mode.

Figure 5:
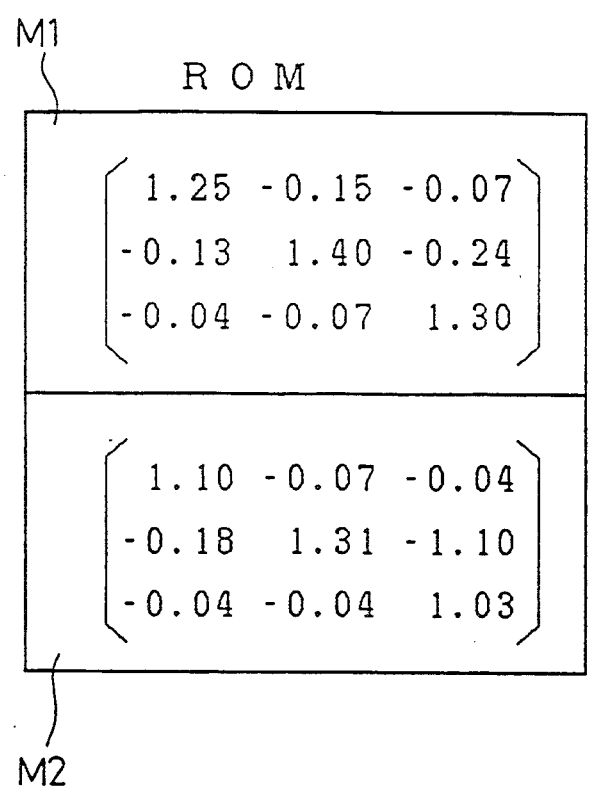
FIG. 5 is a view of a table stored in storage device incorporated into the color image processing unit of FIG. 3.

The ROM 20, which functions as parameter storage means, stores two different parameters respectively for color signal modification when the recording sheet K is to be glazed and color signal modification when the recording sheet K is not to be glazed. The parameters are a 3-line 3-column matrix M1 for color signal modification when the recording sheet K is not to be glazed and a second 3-line 3-column matrix M2 for color signal modification when the recording sheet K is to be glazed as shown in FIG. 5.

The color image processing unit 3 is also provided with a RAM 21 and a CPU 22 which carries out image processing operations. The color image processing unit 3 has a laser controller 24 which drives the laser light source 23 of the color picture recorder 4 on the basis of color signals as control signals. The color image processing unit 3 is also provided with an original picture storage device 19 for storing a digital color signals.

The CPU 22, which functions as the parameter determining means, chooses either the matrix M1 of parameters or the matrix M2 of parameters from the ROM 20 based on the surface-finishing mode selected by operating the surface-finishing mode selecting button 41. The CPU 22, the RAM 21, the ROM 20, the laser controller 24, the A/D converter 18, the original picture storage device 19 and the sheet guide shifting unit 46A are electrically connected with each other through a bus line.

The digital color signal is modified for color signal modification by using the coefficient for color signal modification and Expression (1) to determine printer control signals for controlling the cyan printing C, the magenta printing M and the yellow printing Y. Such a method of color signal modification is designated as a color masking method, which will be described hereinafter with reference to FIG. 6.

Figure 6:
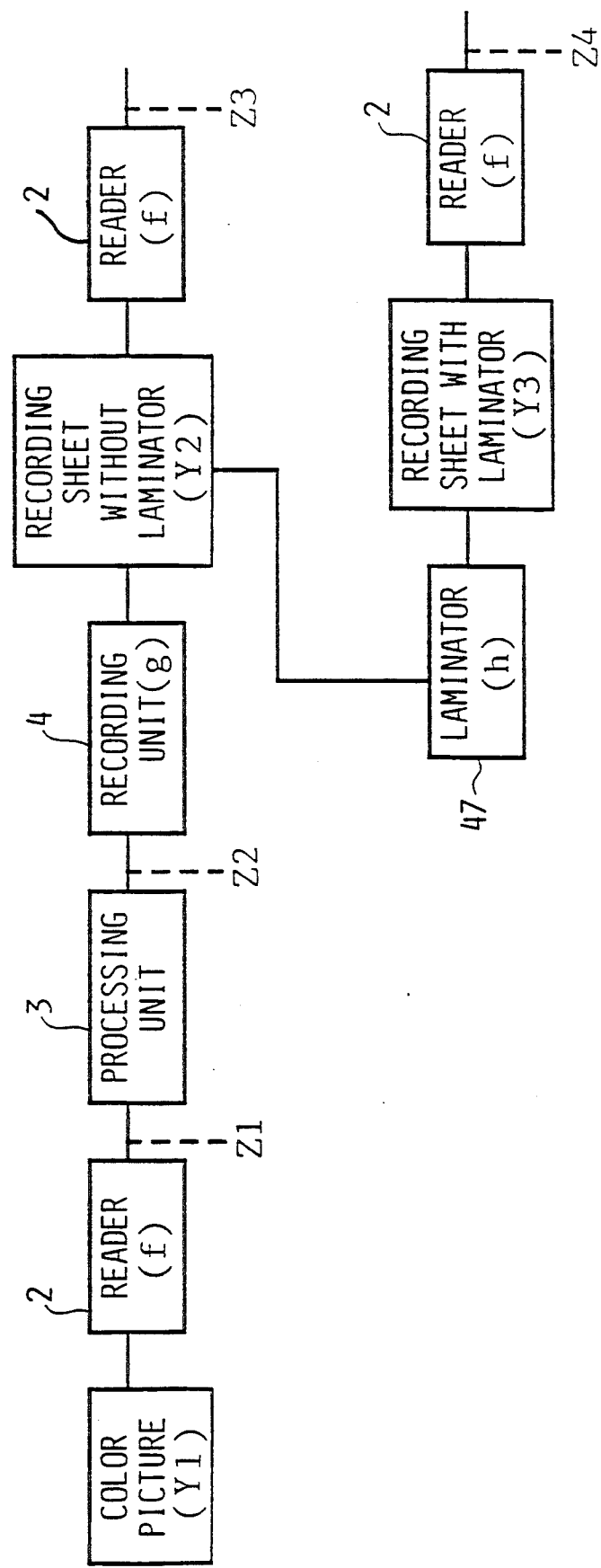
FIG. 6 is a block diagram showing the data conversion as executed by the color image processing unit of FIG. 3 according to the flow of data.

FIG. 6 shows color signal modifying steps, to be carried out by the color image processing unit, and the flow of the color data.

The image of the original color picture S is composed of many minute picture elements, for example, sixty-four elements per square millimeter in dot density. Referring to FIG. 6, the color picture reader 2 reads the original color picture S and gives image data representing the original color picture S through the color picture processing unit 3 to the color recording unit 4. The color recording unit 4 records the color image on a recording sheet K. The color picture reader 2 reads the color picture recorded on the recording sheet K before glazing to determine an intensity of the color image data. The laminator 47 glazes the recording sheet K and the color picture reader 2 again reads the color picture to determine the intensity of the color image data after glazing of the recording sheet K.

Y1 is a matrix of a red-component value R of the red-component of the picture elements of the original color picture S, a green-component value G of the green-component of the picture elements of the same, and a blue-component value B of the blue-component of the picture elements of the same. The red-component value R, the green-component value G and the blue-component value B are those determined by, for example, a multiple light source spectroscopic colorimeter MSC-2 which is produced by Gasu Shikenki K.K.

Y2 is a matrix of a red-component value R of the red-component of the color picture on the unglazed recording sheet K, a green-component value G of the green-component of the same, and a blue-component value B of the blue-component of the same. The red-component value R, the green-component value G and the blue-component value B are those determined by the multiple light source spectroscopic colorimeter MSC-2.

Y3 is a matrix of a red-component value R of the color picture on the glazed recording sheet K, a green-component value of the green-component of the same, and a blue-component value B of the green-component of the same, which are those determined by the multiple light source spectroscopic colorimeter MSC-2.

The multiple light source spectroscopic colorimeter MSC-2 senses the colors of the picture elements like the human retina and provides numerical data representing the colors. When the values of the matrix Y1 and the corresponding values of the matrix Y2 are the same, humans will decide that the colors of the color picture on the unglazed recording sheet K are the same as the colors of the original color picture S. Similarly, when the values of the matrix Y1 and the corresponding values of the matrix Y3 are the same, humans will decide that the colors of the color picture on the glazed recording sheet K are the same as those of the original color picture S.

Z1 is a matrix of digital values representing the red-component value R, green-component value G and blue-component value B of the red, green and blue-components, respectively, of the picture elements of the original color picture S which are determined by converting data provided by the CCD 13 of the color picture reader 2 into digital data by the A/D converter 18.

Z2 is a matrix of a cyan printer control signal C, a magenta printer control signal M and an yellow printer control signal Y. The color image processing unit 3 produces the matrix Z2 of the printer control signals by the color signal modifying operation using Expression (1). The values of the control signals C, M and Y in the matrix Z2 indicate the densities of cyan, magenta and yellow in the printed color picture.

Z3 is a matrix of a red-component value R, a green-component value G and a blue-component value B of the colors of the picture elements of the color picture on the unglazed recording sheet K.

A character f represents the general color reading characteristics of the color picture reader 2. Values of colors read by the color picture reader 2 are different from those determined by the multiple light source spectroscopic colorimeter MSC-2.

The relationship between the digital values of the matrix Z1, the values of the matrix Y1 and the color reading characteristics f is expressed by:

$$Z1 = f(Y1) \tag{1}$$

Similarly, the relationship between the values of the matrix Z3, the values of the matrix Y2 and the color reading characteristics f is expressed by:

$$Z3 = f(Y2) \tag{2}$$

Similarly, the relationship between the values of the matrix Z4, the values of the matrix Y3 and the color reading characteristics f is expressed by:

$$Z4 = f(Y3) \qquad (3)$$

A character g indicates the general characteristics of the color recording unit 4 affecting the colors of the picture elements of the picture. The relationship between the values of the matrix Z2, the values of the matrix Y1 and the characteristics g is expressed by:

$$Y2 = g(Z2) \qquad (4)$$

A character h indicates the general characteristics of the laminator 47 as it affects the colors of the picture elements of the picture. The relationship between the matrices Y2 and Y3 and the characters h is expressed by:

$$Y3 = h(Y2) \qquad (5)$$

When the recording sheet K is not glazed, the original color picture S must be copied so that the color picture on the recording sheet K represented by the matrix Y2 must give the same color sensation as that given by the original color picture S. Therefore, $$Y1 = Y2 \qquad (6)$$

If the color picture reader 2 meets the generally known Luther condition, $$Z1 = Z3 \qquad (7)$$

The Luther condition is described in detail in J.A.C. Yule, "Principles of Color Reproduction", John Wiley & Sons, New York, pp.126-150 (1967). Briefly, the Luther condition is met when the color picture reader 2 correctly receives the light reflected by a color picture regardless of the type of coloring matters in reading the color picture.

Substituting Equation 4 into Equation 2, $$Z3 = f(g(Z2)) \qquad (6)$$

Therefore, $$Z2 = g-1(f-1(Z3)) \qquad (7)$$

Supposing g−1(f−1( )) is a matrix I, then $$Z2 = I(Z1) \qquad (8)$$

The matrix I corresponds to the 3-line 3-column matrix M1 of parameters to be used in Expression (1) for calculating recording conditions in case the recording sheet is not to be glazed after recording.

Conditions for recording the original color picture S on a recording sheet and glazing the recording sheet after recording must meet a requirement that the color picture corresponding to the matrix Y3 and picture printed on the recording sheet must give the same color sensation as that given by the original color picture S corresponding to the matrix Y1 and therefore, $$Y1 = Y3 \qquad (9)$$

However, if the color picture reader 2 meets the Luther condition, $$Z1 = Z4 \qquad (10)$$

Substituting Equation 4 into Equation 5, and substituting Equation 5 into Equation 3, $$Z4 = f(h(g(Z2))) \qquad (12)$$

Inverting Equation 12, $$Z2 = g-1(h-1(f-1(Z4))) \qquad (13)$$

When g−1(h−1( )) is a matrix J, then $$Z2 = J(Z1) \qquad (14)$$

The matrix J corresponds to the 3-line 3-column matrix M2 of parameters to be used in Expression (1) for calculating recording conditions in case the recording sheet is to be glazed after recording.

A method of determining optimum values for the coefficients aij of the 3-line 3-column matrices I and J uses the method of least squares, which is employed also in U.S. Pat. No. 4,458,265, will be described hereinafter.

When the recording sheet is not to be glazed after recording, since there are nine coefficients aij, printer control signals Tjk (j=C, M and Y, k=1 to n) (corresponding to the printer control signals of Z2 (C, M and Y), and read values of the matrix Z1 (R, G and B) uses more than nine matrices.

The recording sheet K carrying a color picture is delivered without glazing the same, the recording sheet K is placed on the transparent contact glass plate 5, and then the color picture reader 2 reads the color picture. Suppose that three color components to be read corresponding to the printer control signals Tjk are Xik (i=R, G and B, k=1 to n). Then, if aij are determined so as to meet $$T_{jk} = \sum_{i=1}^{3} a_{ij} X_{ik} \qquad (2)$$

Expression (1) meets optimum color reproducing conditions. If ejk is defined by:

$$e_{jk} = T_{jk} - \sum_{i=1}^{i=3} a_{ij} X_{ik} \qquad (3)$$

and Fj is defined by:

$$F_j = \sum_{k=1}^{k=n} e_{jk}^2 = \sum_{k=1}^{k=n} \left( T_{jk} - \sum_{i=1}^{i=3} a_{ij} X_{ik} \right)^2 \qquad (4)$$

a value of $a_{ij}$ that makes the partial derivative of Fj with respect to $a_l$, i.e., an optional one of $a_{ij}$, zero gives a minimum of $F_j$.

$$F_j/a_1 = -2 \sum_{k=1}^{k=n} \left[ \left( T_{jk} - \sum_{i=1}^{i=3} a_{ij} X_{ik} \right) \right] X_{ik} = 0 \qquad (5)$$

$$\sum_{k=1}^{k=n} T_{jk} K_{ik} = \sum_{k=1}^{k=n} \sum_{i=1}^{i=3} a_{ij} X_{ik} X_{ik} \qquad (6)$$

$$\sum_{k=1}^{k=n} T_{jk} K_{ik} = \sum_{i=1}^{i=3} \left\{ a_{ij} \left( \sum_{k=1}^{k=n} X_{ik} X_{ik} \right) \right\} \quad (7)$$

therefore, optimum values for aij can be determined by solving the simultaneous linear equations.

On the other hand, the printed recording sheet K may be glazed and the same procedure may be performed. Since there are nine coefficients aij, the printer control signals Tjk (j=C, M and Y, k=1 to n) (corresponding to the printer control signals C, M and Y of the matrix Z2) and the measured values R, G and B use more than nine matrices.

The values for aij for a copying mode in which the recording sheet is to be glazed after recording and those for aij for a copying mode in which the recording sheet is not to be glazed are different from each other.

Figure 4A:
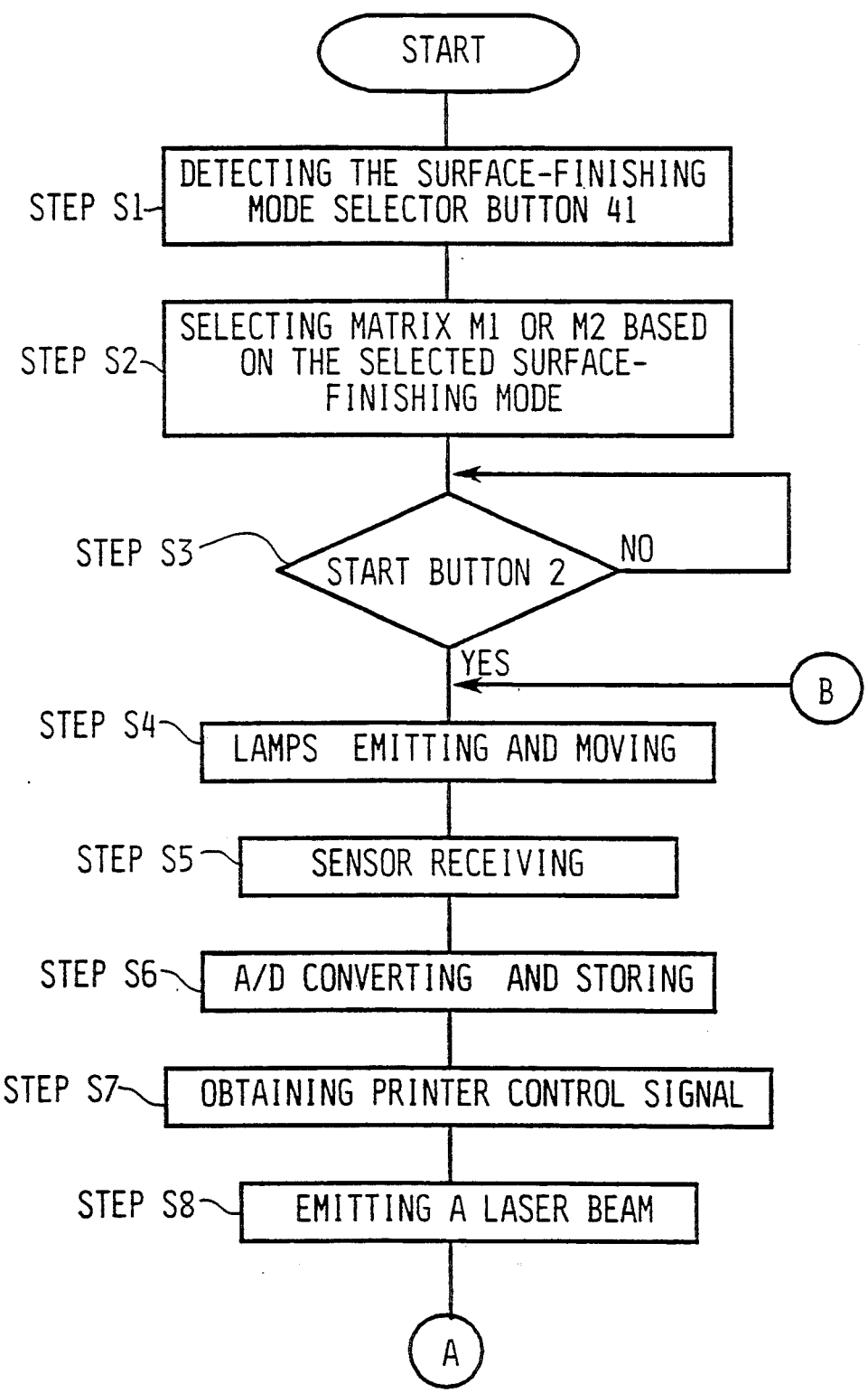
FIGS. 4A and 4B are flow charts showing steps of operation of the color image processing unit of FIG. 3.
Figure 4B:
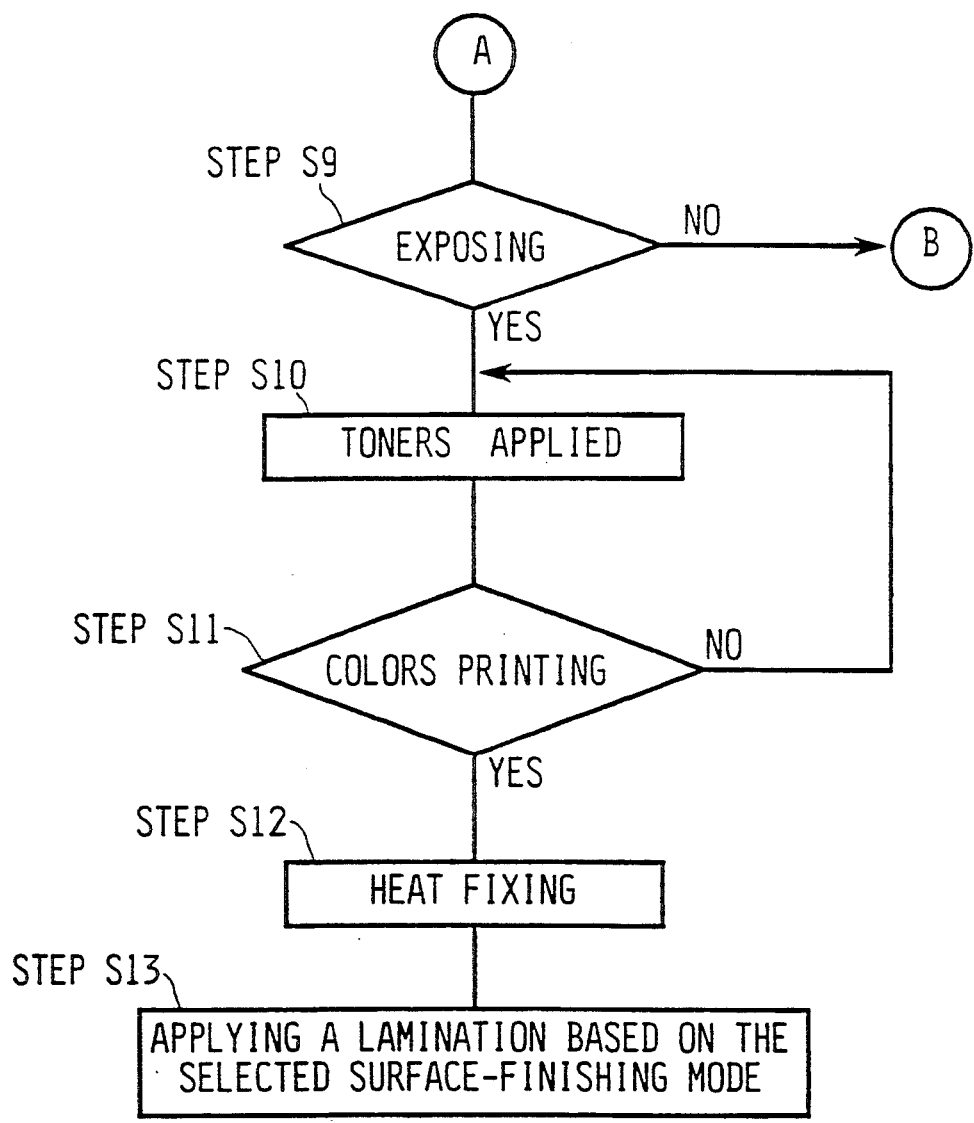

The operation of the digital color copying machine 1 will be described hereinafter with reference to FIGS. 4A and 4B.

In step S1, the surface-finishing mode selector button 41 is detected to select either the surface-finishing mode for glazing or the surface-finishing mode for unglazing. In step S2, the coefficients of either the matrix M1 or M2 stored in the ROM 20 are selected based on the selected surface-finishing mode, and the selected coefficients are stored in the RAM 21. In step S3, a query is made to see if the start button 42 has been pressed. If the response in step S3 is affirmative, an original picture S is delivered from the original receiving tray 14 to the transparent contact glass plate 5 by the original conveying device 16.

In step S4, the fluorescent lamps 7 are moved in the subscanning direction by the light source moving device 9 to expose the original color picture S placed on the transparent contact glass plate 5 to the white light emitted by the fluorescent lamps 7 during scanning. In step S5, the solid-state image sensor 13 receives the light reflected by the original color picture S, after passing through the lens 11 and the filter unit 12, and converts the light into corresponding digital signals. The filter unit 12 has red, green and blue filters which transmit only red light, green light and blue light, respectively. As the carriage 10 is moved by the light source moving device 9, the red, green and blue filters of the filter unit 12 are placed sequentially in front of the solid-state image sensor 13 for each scanning line.

In step S6, analog electric signals provided by the solid-state image sensor 13, respectively, corresponding to picture elements, are converted into digital color signals by the A/D converter 18 and the digital color signals are stored in an original picture storage device 19.

In step S7, the digital color signals stored in the original picture storage device 19 are subjected to a color signal modifying process to modify the same by using the color signal modifying coefficients stored in the RAM 21 and Expression (1) to obtain a cyan printer control signal C, a magenta printer control signal M and an yellow printer control signal Y.

In step S8, these printer control signals are applied to the laser controller 24 and the laser light source 23 emits a laser beam. The laser beam is reflected by the polygonal rotating mirror 26 on the photoconductive drum 27, uniformly charged by the charger 28, to form an electrostatic latent image on the photoconductive drum 27. In step S9, a query is made to see if the entire copying area of the photoconductive drum 27 has been exposed to the laser beam. If the response in step S9 is negative, the routine returns to step S4. If the response in step S9 is affirmative, the cyan, magenta and yellow toners are applied to the electrostatic latent image by the cyan developing unit 29, the magenta developing unit 30 and the yellow developing unit 31 in step S10. In step S11, a query is made to see if all the colors have been printed.

If the response in step S11 is affirmative, namely, when the developing process is completed, a recording sheet K drawn out from the sheet cassette 36 is wound around a transfer drum 37 and the toner image is transferred from the photoconductive drum 27 to the recording sheet K. Toners remaining on the photoconductive drum 27 are removed by the cleaning unit 35.

The toner image transferred to the recording sheet K is heat-fixed by the fixing unit 38 while the recording sheet K is being conveyed by the sheet conveying unit 40 in step S12. If the recording sheet need not be glazed, the recording sheet K is delivered to the delivery tray 39. If the recording sheet K needs to be glazed on the basis of the selected surface-finishing mode, the recording sheet K is delivered to the delivery tray 45 after the application of a lamination material R to the recording sheet K by the laminator 47 in step S13.

The result of color modification by the controller by using the matrix M1 or M2 shown in FIG. 5 and stored in the RAM 20 will be described hereinafter.

Suppose that the color picture reader 2 read the original color picture S and provided color picture signals (R, G, B)=(40, 7, 3). The matrix M1 was used because the recording sheet need not be glazed, as selected by the operator, and printer control signals (C, M, Y)=(49, 0, 2) were calculated by using Expression (1), in which all the negative values were represented by "0". The color recording unit 4 was controlled by the printer control signals (49, 0, 2) to record a color picture on the recording sheet K. The color picture reader 2 read the picture recorded on the recording sheet K and provided color signals (R, G, B)=(40, 6, 3). Thus, the color signals representing the colors of the picture recorded on the recording sheet K agreed substantially with those representing the colors of the original color picture S.

When the recording sheet K needs to be glazed, as selected by the operator, printer control signals (C, M, Y) are calculated by using Expression (1) and the matrix M2. Then the calculated printer control signals (C, M, Y) are (34, 0, 1), in which all the negative values were represented by "0", and the color recording unit 4 is controlled by the printer control signals (34, 0, 1) to record a color picture on the recording sheet K. The color picture reader 2 read the color picture and provided color signals (36, 4, 2). The color picture produced was read again by the color picture reader 2 after glazing the recording sheet K by the laminator 47 and provided color signals (40, 7, 3). Thus, the color signals representing the colors of the color picture produced on the glazed recording sheet K agreed substantially with those representing the colors of the original color picture S.

The present invention is not limited to the foregoing embodiments in its practical application. For example, the color signal modification may be achieved by a color signal modifying system using a generally known look-up table and an interpolation process instead of the foregoing color masking system. The present invention may be applied to a color printer separately comprising a color picture reader and a recording unit as well as to the foregoing digital color copying machine. The present invention may be applied to a digital color copying machine which is not provided with a laminator as glazing means in a frame of the machine.

As is apparent from the foregoing description, the present invention is capable of satisfactorily reproducing the colors of an original color picture in a copy regardless of the surface condition of the recording sheet because the present invention uses different parameters for color signal modification according to the operator selected surface-finishing mode, i.e., a surface-finishing mode in which the recording sheet is glazed or a surface-finishing mode in which the recording sheet is not glazed.

While this invention has been described in connection with specific embodiments thereof, it is evident that many alternative modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A color copying machine comprising:
   a signal input means for inputting color signals representing colors of a color original, the color signals being separated on the basis of primary colors;
   a recording means for recording a color image on a recording medium on the basis of a plurality of control signals indicating respective quantities of respective coloring matters to be applied to the recording sheet, a color of the coloring matters being different from the primary colors of the color signals input by said signal input means;
   a signal changing means for changing the color signals input by said signal input means into the control signals used by said recording means on the basis of parameters so that the colors of the color original coincide with the colors of the color image on the recording medium recorded by said recording means;
   a glazing means for glazing the color image on the recording medium which has been recorded by said recording means;
   a surface-finishing mode selecting means for selecting one of a first surface-finishing mode in which the recording medium is glazed by said glazing means after recording the color image thereon and a second surface-finishing mode in which the recording medium is not glazed by said glazing means after recording the color image thereon;
   a parameter storage means for storing a plurality of parameters corresponding to the surface-finishing modes selected by said surface-finishing mode selecting means; and
   a parameter determining means for determining one of the parameters stored in said parameter storage means based on the surface-finishing mode selected by said surface-finishing mode selecting means and for outputting color signals to said recording means.

2. The color copying machine as claimed in claim 1, wherein said recording means records a color image on a recording sheet by using cyan, magenta, and yellow material.

3. The color copying machine as claimed in claim 1, wherein said glazing means comprises a laminator laminating a transparent lamination material onto a recording sheet.

4. The color copying machine as claimed in claim 1, wherein the parameter selecting means comprises a key for selecting surface-finishing mode.

5. A color copying method comprising steps of:
   inputting color signals representing colors of an original color picture, the color signals being separated on the basis of primary colors;
   selecting one of a first surface-finishing mode for glazing the surface of a recording medium after recording a color image thereon and a second surface-finishing mode for not glazing a surface of the recording medium after recording a color image thereon;
   determining parameters among a plurality of parameters corresponding to the surface-finishing modes;
   changing the input color signals into control signals on the basis of the determined parameters so that the colors of the color original coincide with the colors of the recorded color image on the recording medium, the control signals indicating respective quantities of respective coloring matters to be applied to the recording sheet, color of the coloring matters being different from the primary colors of the color signals input;
   recording the color image on the recording medium on the basis of the control signals; and
   glazing the recording medium after recording a color image thereon when the first surface-finishing mode is selected.

6. The color copying machine as claimed in claim 1, wherein said signal input means comprises:
   a filter means for separating light reflected from the color original into the primary colors; and
   an image sensor means for receiving light components corresponding to the primary colors into electrical color signals.

7. The color copying machine as claimed in claim 1, wherein said signal changing means comprises an analog-to-digital convertor.

8. The color copying machine as claimed in claim 1, wherein said parameter determining means comprises a central processing unit that adjusts the intensity of color signals output to said recording means based upon parameters stored in said parameter storage means.

9. The color copying method as described in claim 5, further comprising the steps of:
   determining an intensity of colors of a recorded image; and
   comparing the intensity of colors of the recorded image with those of the original color picture.

* * * * *